US010854547B2

(12) United States Patent
Mahler et al.

(10) Patent No.: US 10,854,547 B2
(45) Date of Patent: Dec. 1, 2020

(54) CHIP PACKAGE WITH CROSS-LINKED THERMOPLASTIC DIELECTRIC

(71) Applicant: Infineon Technologies AG, Neubiberg (DE)

(72) Inventors: Joachim Mahler, Regensburg (DE); Georg Meyer-Berg, Munich (DE); Guenter Tutsch, Saal (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 16/279,370

(22) Filed: Feb. 19, 2019

(65) Prior Publication Data

US 2019/0287907 A1    Sep. 19, 2019

(30) Foreign Application Priority Data

Mar. 13, 2018  (DE) .................. 10 2018 105 731

(51) Int. Cl.
| *H01L 23/532* | (2006.01) |
| *H01L 23/31* | (2006.01) |
| *H01L 23/495* | (2006.01) |
| *H01L 21/56* | (2006.01) |
| *H01L 25/07* | (2006.01) |
| *H01L 23/00* | (2006.01) |

(52) U.S. Cl.
CPC ........ *H01L 23/5329* (2013.01); *H01L 21/565* (2013.01); *H01L 23/3121* (2013.01); *H01L 23/49562* (2013.01); *H01L 23/49586* (2013.01); *H01L 24/09* (2013.01); *H01L 24/49* (2013.01); *H01L 25/072* (2013.01)

(58) Field of Classification Search
CPC ............... H01L 2924/181; H01L 21/56; H01L 23/5329; H01L 23/293
See application file for complete search history.

(56) References Cited

U.S. PATENT DOCUMENTS

| 2,706,798 | A | * | 4/1955 | Kodama | .................. | H01G 4/06 |
| | | | | | | 361/306.1 |
| 6,316,566 | B1 | * | 11/2001 | Ma | .................... | C08G 18/73 |
| | | | | | | 526/264 |
| 6,379,988 | B1 | | 4/2002 | Peterson et al. | | |
| 9,966,516 | B2 | | 5/2018 | Schlosser et al. | | |
| 2001/0012680 | A1 | | 8/2001 | Cobbley et al. | | |
| 2006/0198147 | A1 | | 9/2006 | Ge | | |
| 2006/0241215 | A1 | | 10/2006 | Osada et al. | | |
| 2011/0133245 | A1 | * | 6/2011 | Zhou | .................... | C08F 8/04 |
| | | | | | | 257/99 |
| 2011/0275726 | A1 | * | 11/2011 | Wilson | ................ | C08G 18/673 |
| | | | | | | 521/50.5 |
| 2018/0044169 | A1 | * | 2/2018 | Hatcher, Jr. | ......... | H01L 23/3114 |

FOREIGN PATENT DOCUMENTS

| DE | 10 2005 036 520 | 11/2006 |
| DE | 10 2010 027 239 | 1/2012 |
| DE | 10 2014 215 939 | 2/2016 |
| EP | 0044136 | 1/1982 |
| JP | 2014-189712 | 10/2014 |

* cited by examiner

*Primary Examiner* — Quoc D Hoang
(74) *Attorney, Agent, or Firm* — Dicke, Billig & Czaja, PLLC

(57) ABSTRACT

A package and method of manufacturing a package is disclosed. In one example, the package includes an electronic chip and a dielectric structure comprising a highly filled cross-linked thermoplastic material.

18 Claims, 2 Drawing Sheets

US 10,854,547 B2

CHIP PACKAGE WITH CROSS-LINKED THERMOPLASTIC DIELECTRIC

CROSS-REFERENCE TO RELATED APPLICATION

This Utility Patent Application claims priority to German Patent Application No. 10 2018 105 731.8, filed Mar. 13, 2018, which is incorporated herein by reference.

FIELD OF THE INVENTION

The present invention relates to packages, and methods of manufacturing a package.

BACKGROUND OF THE INVENTION

A package, for instance for automotive applications, provides a physical containment for one or more electronic chips comprising one or more integrated circuit elements. Examples of integrated circuit elements of packages are a field effect transistor, an insulated-gate bipolar transistor (IGBT), a diode, and passive components (such as an inductance, a capacity, a resistor). Moreover, such packages may be used for producing a system-in-package.

For manufacturing a package, at least one electronic chip may be encapsulated by an appropriate encapsulant. For this purpose, curable epoxy resin is used in many cases as encapsulant. Such an encapsulant has the advantage that it is processable and mechanically stable.

However, there is still potentially room to improve reliability of a package, in particular in terms of the properties of an encapsulant or another dielectric structure of the package.

BRIEF DESCRIPTION OF THE DRAWINGS

The accompanying drawings, which are included to provide a further understanding of exemplary embodiments and constitute a part of the specification, illustrate exemplary embodiments.

In the drawings.

Figure 1:
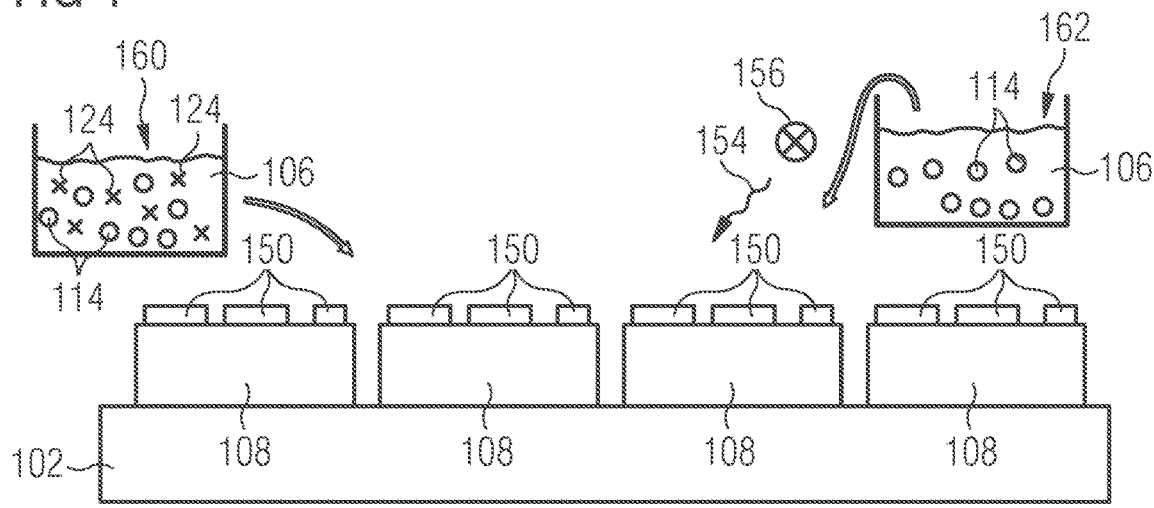
FIG. 1 shows a cross-sectional view of a pre-form of a package according to an exemplary embodiment.

There may be a need for a chip package with proper electric reliability while being mechanically and thermally robust.

According to an exemplary embodiment, a package is provided which comprises an electronic chip and a dielectric structure comprising a highly filled cross-linked thermoplastic material (in particularly filled with filler particles).

According to another exemplary embodiment, a package is provided which comprises a chip carrier, an electronic chip mounted on the chip carrier, and a dielectric structure covering at least part of at least one of the chip carrier and the electronic chip and comprising an optically opaque cross-linked thermoplastic material.

According to another exemplary embodiment, a method of manufacturing a package is provided, wherein the method comprises mounting an electronic chip on a chip carrier, and forming a dielectric structure covering at least part of at least one of the chip carrier and the electronic chip by cross-linking a highly filled thermoplastic material.

According to still another exemplary embodiment, a method of manufacturing a package is provided, wherein the method comprises forming a dielectric structure covering at least part of the electronic chip (and/or a chip carrier on which the chip may be mounted) by cross-linking an opaque thermoplastic material.

According to an exemplary embodiment, a highly filled cross-linked thermoplastic material is employed as dielectric structure of a chip package. Such an electrically insulating material, which may be used for instance for an encapsulant and/or a dielectric layer, synergistically combines many technical advantages. On the one hand, a thermoplastic material allows significantly reducing humidity in the dielectric material as compared to conventional materials such as epoxy resin. At the same time, the electrically insulating properties of such a material may be significantly improved as compared to conventional curable epoxy resin. This significantly improves the electrical reliability of the package, in particular increases the dielectric strength of the package. By specifically and artificially triggering cross-linking of such a thermoplastic material (which does not occur per se in a thermoplastic material), mechanical stability and thermal stability of the dielectric material can be improved. Descriptively speaking, cross-linking chains of the thermoplastic material may allow combining advantageous properties of thermosetting materials in terms of mechanical stability and thermal stability, while simultaneously improving the electric reliability and the protection against humidity.

Highly advantageously, such a dielectric structure may comprise, in addition to the cross-linked thermoplastic material, a significant amount of filling particles which allows specifically adapting the properties of the dielectric structure in accordance with the chip package functionality. As a result, highly filled cross-linked thermoplastics are provided as dielectric structure for high performance chip package applications.

Also advantageously, the dielectric structure comprising cross-linked thermoplastic material may be opaque. It has turned out that for many electronic applications, in particular for power semiconductor applications, the propagation of significant amount of visible light into an interior of the package may trigger undesired reactions and effects there and may hence disturb the electronic functionality. By rendering the dielectric structure substantially optically intransparent, the electric reliability of the package and the operation of the package may be improved. In particular, making the dielectric structure substantially opaque may safely prevent the chip package from a radiation-triggered electronic misoperation.

In the following, further exemplary embodiments of the packages and the methods will be explained.

In the context of the present application, the term "package" may particularly denote at least one partially or fully encapsulated and/or coated electronic chip with at least one, direct or indirect, external electric contact.

In the context of the present application, the term "electronic chip" may particularly denote a chip (more particularly a semiconductor chip) providing an electronic function. The electronic chip may be an active electronic component. In one embodiment, the electronic chip is configured as a controller chip, a processor chip, a memory chip, a sensor chip or a micro-electromechanical system (MEMS). In an alternative embodiment, it is also possible that the electronic chip is configured as a power semiconductor chip. Thus, the electronic chip (such as a semiconductor chip) may be used for power applications for instance in the automotive field and may for instance have at least one integrated insulated-gate bipolar transistor (IGBT) and/or at least one transistor of another type (such as a MOSFET, a JFET, etc.) and/or at least one integrated diode. Such integrated circuit elements may be made for instance in silicon technology or based on wide-bandgap semiconductors (such as silicon carbide, gallium nitride or gallium nitride on silicon). A semiconductor power chip may comprise one or more field effect transistors, diodes, inverter circuits, half-bridges, full-bridges, drivers, logic circuits, further devices, etc. The electronic chip may be a naked die or may be already packaged or encapsulated.

In the context of the present application, the term "chip carrier" may particularly denote an at least partially electrically conductive structure which serves simultaneously as a mounting base for one or more electronic chips and also contributes to the electric connection of the electronic chip(s) with an electronic environment of the package. In other words, the chip carrier may fulfil a mechanical support function and an electric connection function. A preferred embodiment of a carrier is a leadframe.

In the context of the present application, the term "thermoplastic material" may particularly denote a plastic material, in particular a polymer, that becomes molten, flowable or moldable above a specific temperature and solidifies upon cooling. The polymer chains of a thermoplastic material associate through intermolecular forces, which weaken rapidly with increased temperature, yielding a viscous liquid and/or by mechanical entanglement of the individual polymer chains. Thus, thermoplastics may be reshaped by heating and may be made subject to polymer processing techniques such as injection molding or compression molding. Thermoplastics differ from thermosetting polymers (such as curable epoxy resin), which forms irreversible chemical bonds during a curing process. Hence, thermoset plastics and thermoplastics have very different properties. A physical difference is that thermoplastics can be re-melted back into a liquid, whereas thermoset plastics remain in a permanent solid state. Thermoset plastics contain polymers with chemical reactive structures of groups that cross-link together during the curing process to form an irreversible chemical bond. Thermoplastics soften when heated and become more fluid as additional heat is applied. The curing process is completely reversible as no chemical bonding takes place.

In the context of the present application, the term "cross-linked material" may particularly denote a material comprising cross-links. The term cross-link may denote a bond that links one polymer chain to another. They can be covalent bonds or ionic bonds. When the term "cross-linking" is used in the (in particular synthetic) polymer field, it may refer to the use of cross-links to promote a difference in the polymers' physical properties.

In the context of the present application, the term "cross-linked thermoplastic material" may particularly denote a thermoplastic material which has been specifically treated so as to form cross-links between chains of the thermoplastic material. Descriptively speaking, such a cross-linked thermoplastic material may be a hybrid structure having thermoplastic properties and having thermosetting properties. In contrast to pure thermosetting materials, thermoplastic materials do not intrinsically carry out cross-linking. However, thermoplastic materials may be triggered to form cross-links chains by the application of an energetic beam (in particular an energetic electron beam) and/or by adding cross-linking agents (such as peroxides) being functionalized to force chains of a thermoplastic material to cross-link.

In the context of the present application, the term "highly filled material" may particularly denote a dielectric material comprising a matrix of a cross-linked thermoplastic material filled to a significant amount with particles and additives. In particular, the partial weight or volume of the filling particles of the highly filled material may be larger than the partial weight or volume of the matrix of thermoplastic material. The filling particles may be added for adjusting or tuning the properties of the dielectric structure, in particular to provide thermal conductivity, to increase mechanical stability, to promote adhesion, etc.

In the context of the present application, the term "optically opaque material" may particularly denote a material being substantially intransparent at least for visible light. Such an optically opaque material may thus prevent visible light from propagating through the optically opaque material.

In an embodiment, the cross-linked thermoplastic material comprises chains being connected by a cross-linking structure. The term "cross-linking structure" may particularly denote a chemical compound linking different chains of the thermoplastic material and being obtained as a reaction product of cross-linking agents (such as peroxides) added during manufacturing the dielectric structure. In other words, a cross-linking structure may be formed as a result of a cross-linking reaction between a cross-linking agent and chains of the thermoplastic material.

In an embodiment, the cross-linked thermoplastic material has a degree of cross-linking in a range between 2% and 90%, in particular in a range between 5% and 50%. The degree of cross-linking may indicate a percentage of repetitive monomer units in the chains of the thermoplastic material being cross-linked. With the mentioned ranges, the advantageous properties of a dielectric structure for a package described above and being obtained by triggering cross-linking of thermoplastic material may be very pronounced.

In an embodiment, the dielectric structure comprises filler particles, in particular comprises at least 50 weight percent filler particles in relation to the entire weight of the dielectric structure, more particularly comprises filler particles in a range between 80 weight percent and 95 weight percent in relation to the entire weight of the dielectric structure. A dielectric structure with highly advantageous properties may be obtained already with a very low amount of cross-linked thermoplastic material, for instance already at 5 weight percent. Thus, there is a high degree of freedom for a circuit designer of adding filler particles and additives of various type and high amount without compromising on the properties of a chip package, in particular for power semiconductor applications.

In an embodiment, the filler particles comprise at least one of the group consisting of thermally highly conductive filler particles (in particular at least one of aluminum oxide ($Al_2O_3$) particles, aluminum nitride (AlN) particles, silicon oxide ($SiO_2$) particles, and boron nitride (BN) particles), a colorant (in particular carbon black for obtaining an opaque or black package, or titanium dioxide ($TiO_2$) for obtaining a white package), an adhesion promoter (n particular based on silane), and a catalyst (for accelerating a chemical reaction, for instance for accelerating cross-linking). Additionally or alternatively, many other types of filler particles and/or additives may be added to the thermoplastic material to promote at least one physical property thereof, for instance mechanical stability. For example, it is also possible to add filler particles or additives which adjust the values of the coefficient of thermal expansion of the dielectric structure with respect to material of the electronic chip (in particular silicon) and/or with respect to material of the chip carrier (in particular copper in case of a leadframe).

In an embodiment, the dielectric structure is substantially opaque, in particular has an optical transparency of less than 2%. In the context of the present application, the term "optical transparency" may in particular denote a ratio between visible light intensity being transmitted through the dielectric structure divided by visible light intensity supplied to the dielectric structure. In particular, the dielectric structure may absorb and/or reflect at least 98% of the supplied light intensity. Thus, visible light (i.e. electromagnetic radiation in a range of wavelengths from 400 nm to 800 nm) may be largely prevented from propagating into the package. This may stabilize the function of the package and may suppress undesired artefacts.

In an embodiment, the dielectric structure has a value of the thermal conductivity of at least 0.5 W/(mK), in particular at least 1 W/(mK). Such a high value of the thermal conductivity may be obtained by adding corresponding filler particles with sufficiently high thermal stability. As a result, heat generated in an interior of the package, for instance dissipated during operating the electronic chip (in particular a power semiconductor chip) may be efficiently removed out of the package via the dielectric structure. Thus, the dielectric structure may also contribute to the thermal performance of the package.

In an embodiment, the dielectric structure is configured as an encapsulant at least partially encapsulating at least one of the electronic chip and the carrier. This may be advantageous for instance for protecting sensitive devices like GaN/SiC devices. In the context of the present application, the term "encapsulant" may particularly denote a substantially electrically insulating and preferably thermally conductive material surrounding an electronic chip and/or part of a chip carrier to provide mechanical protection, electrical insulation, and optionally a contribution to heat removal during operation. Such an encapsulant can be, for example, a mold compound. For the encapsulating by molding, a cross-linked thermoplastic material may be used, as described herein. Filler particles (for instance $SiO_2$, $Al_2O_3$, $Si_3N_4$, BN, AlN, diamond, etc.), for instance for improving thermal conductivity, may be embedded in a plastic-based matrix of the encapsulant.

In an embodiment, the package comprises a further encapsulant at least encapsulating at least part of the encapsulant. In particular, the further encapsulant may comprise a thermosetting material such as an epoxy based material and/or a silicone based material. Thus, such a further encapsulant may be made of a thermosetting material so as to add a high degree of mechanical stability to the package as a whole. Alternatively, it is also possible that the further encapsulant comprises or consists of a further highly filled and/or opaque cross-linked thermoplastic material.

In an embodiment, the dielectric structure is a layer structure covering at least part of at least one of the electronic chip and the carrier. For example, such a layer structure may be a continuous layer or a patterned layer. Such a layer structure may be applied specifically at a portion of the package where reliable electric insulation is locally required. The advantageous properties of the dielectric structure (high mechanical reliability and electrical reliability, while simultaneously allowing to specifically address the properties of the dielectric structure by freely selecting a high amount of filler particles and additives) made us be obtained as well for a layer structure covering a certain portion of the package.

In an embodiment, the layer structure is covered by a heat sink. For instance, such a heat sink may be a thermally highly conductive body such as a copper plate or an aluminum plate or an alloy of one or more metals. It is also possible that the heat sink is a thermally highly conductive body having a set of cooling fins attached thereto for efficiently removing heat. In one embodiment, a portion of a chip carrier (such as a leadframe) carrying the electronic chip and extending beyond an encapsulant may be covered with a layer-type dielectric structure. In such an embodiment, it is highly advantageous that the material of the dielectric structure is a reliable electric insulator (for preventing electric short circuiting via the dielectric structure) and/or has a sufficiently high thermal conductivity (for significantly contributing to the removal of heat out of the interior of the package, for instance generated by the one or more electronic chips during operation).

In an embodiment, the layer structure is arranged to electrically insulate different electrically conductive portions of the carrier from one another. Advantageously, portions (such as islands which are not connected to one another) of the dielectric structure may be applied between different sections of the chip carrier (in particular different leads, a die pad, etc.) for ensuring a reliable electric insulation between such sections.

In an embodiment, the dielectric structure is configured to be thermally stable at least up to 260° C., in particular at least up to 300° C., more particularly at least up to 350° C. In many package applications, packages are connected to a mounting base such as a printed circuit board by soldering. During soldering, typically temperatures of about 250° C. may occur. When the dielectric structure is thermally stable at least up to such temperatures and preferably above, any undesired melting or delamination or damage phenomena during soldering may be safely prevented. The lifetime and the reliability of the package may thereby be significantly improved. The mentioned high thermal stability may be obtained by cross-linking the thermoplastic material and optionally providing filler particles contributing to the thermal stability as well.

In an embodiment, the thermoplastic material comprises at least one of the group consisting of polyamide, polyetheretherketone, polyethylene terephthalate, polybutylene terephthalate, polyimide, polysulfone, high density polyethylene, polyoxymethylene, polypropylene, and polystyrene. Such thermoplastic materials, as such, would be not suitable for chip packaging, in particular for power semiconductor applications, in view of their limited thermosmechanical stability. However, when cross-linking the thermoplastic material, the required properties may be obtained by combining advantageous properties of thermoplastic materials and of thermosetting materials. By adding filler particles to the mentioned cross-linked thermoplastic material, the physical properties and the usability for (in particular power) chip packages may be further refined.

In an embodiment, the at least one electronic chip comprises a semiconductor chip, in particular a power semiconductor chip. In particular when the at least one electronic chip is a power semiconductor chip, significant amount of heat generated during operation of the package may result in thermal load acting on the electric and mechanical interfaces of the package. However, due to the dielectric structure as disclosed herein, damage of the package may be prevented even under such harsh conditions.

In an embodiment, the electronic chip contains at least one, in particular at least three or at least eight transistors (such as field-effect transistors, in particular metal oxide semiconductor field-effect transistors). Typically, the electronic chip may comprise many transistors.

In an embodiment, the carrier comprises a leadframe and/or a ceramic sheet covered on both opposing main surfaces with a respective metallic layer (in particular a Direct Aluminum Bonding (DAB) substrate and/or a Direct Copper Bonding (DCB) substrate).

In an embodiment, the carrier is a leadframe. Such a leadframe may be a sheet-like metallic structure which can be patterned so as to form one or more mounting sections for mounting the one or more electronic chips of the package, and one or more lead sections for electric connection of the package to an electronic environment when the electronic chip(s) is/are mounted on the leadframe. In an embodiment, the leadframe may be a metal plate (in particular made of copper) which may be patterned, for instance by stamping or etching. Forming the chip carrier as a leadframe is a cost-efficient and mechanically as well as electrically highly advantageous configuration in which a low ohmic connection of the at least one electronic chip can be combined with a robust support capability of the leadframe. Furthermore, a leadframe may contribute to the thermal conductivity of the package and may remove heat generated during operation of the electronic chip(s) as a result of the high thermal conductivity of the metallic (in particular copper) material of the leadframe.

However, other carriers may be implemented as well. For instance, a Direct Copper Bonding substrate (DCB substrate) or a Direct Aluminum Bonding substrate (DAB substrate) can be used as well as a basis for a carrier.

In an embodiment, the method comprises triggering the cross-linking by adding a cross-linking agent to the thermoplastic material and by (for instance thermally) activating the cross-linking agent. Crosslinking may be denoted as the process of chemically joining two or more molecules or chains by a chemical (in particular covalent) bond. Correspondingly, a cross-linking agent may be denoted as a substance triggering cross-linking of a thermoplastic material. For instance, the cross-linking agent comprises at least one of the group consisting of a peroxide, an azo-structure, and silane. Other cross-linking agents may however be implemented as well.

In an embodiment, the method comprises activating the cross-linking agent by heating, in particular melting, a mixture of the thermoplastic material and the cross-linking agent, for triggering the cross-linking. Thus, an already preformed mixture of thermoplastic material (for instance one or more of the above group of polymers) and a cross-linking agent (for instance one or more of the above group) may be liquefied for thermally triggering the cross-linking. The liquefied mixture may for instance be supplied into a processing chamber (such as a mold tool) for triggering cross-linking and forming the dielectric structure covering at least part of the electronic chip and/or at least part of the chip carrier. Hence, the processes of cross-linking and forming a solidified dielectric structure may be carried out simultaneously and therefore in a highly efficient way.

Additionally or alternatively to the provision of one or more cross-linking agents, the method may also comprise triggering the cross-linking by irradiating the (for instance already hardened) thermoplastic material with an energetic beam, in particular an energetic electron beam. In other words, cross-linking may be triggered by an electron beam or a beam of electromagnetic radiation propagating to the thermoplastic material and being configured so as to trigger cross-linking thereof. Cross-linking may thus be initiated by radiation chemistry so that the thermoplastic material is being chemically changed by the radiation. Radiation may thus be used to cross-link the thermoplastic material, in particular polymers thereof. The energetic beam may be irradiated onto the thermoplastic material before, during or after supplying the thermoplastic material to a processing chamber (such as a mold tool) for covering at least part of at least one electronic chip and/or at least part of the chip carrier.

In an embodiment, forming the dielectric structure comprises at least one the group consisting of molding (in particular injection molding), coating, and casting. Molding may be denoted as a process of manufacturing by shaping liquid or pliable raw material using a rigid frame which may be denoted as mold. A mold may be a hollowed-out block or set of tools with an interior hollow volume filled with a liquid or pliable material. The liquid hardens inside the mold, adopting its shape.

In an embodiment, the package comprises at least one electrically conductive connection element, in particular at least one of a bond wire, a bond ribbon and a clip, electrically connecting the electronic chip with the carrier, in particular a lead section of a leadframe. A clip may be a three-dimensionally bent plate type connection element which has two planar sections to be connected to an upper main surface of the respective electronic chip and an upper main surface of the chip carrier, wherein the two mentioned planar sections are interconnected by a slanted connection section. As an alternative to such a clip, it is possible to use a bond wire or bond ribbon which is a flexible electrically conductive wire or ribbon shaped body having one end portion connected to the upper main surface of the respective chip and having an opposing other end portion being electrically connected to the chip carrier. Within the encapsulant, an electrically conductive connection may be formed by the connection element between a chip pad at an upper main surface of the chip mounted on a mounting section of the carrier on the one hand and a lead section of the carrier on the other hand.

As substrate or wafer forming the basis of the electronic chip(s), a semiconductor substrate, preferably a silicon substrate, may be used. Alternatively, a silicon oxide or another insulator substrate may be provided. It is also possible to implement a germanium substrate or a III-V-semiconductor material. For instance, exemplary embodiments may be implemented in GaN or SiC technology.

Furthermore, exemplary embodiments may make use of standard semiconductor processing technologies such as appropriate etching technologies (including isotropic and anisotropic etching technologies, particularly plasma etching, dry etching, wet etching), patterning technologies (which may involve lithographic masks), deposition technologies (such as chemical vapor deposition (CVD), plasma enhanced chemical vapor deposition (PECVD), atomic layer deposition (ALD), sputtering, etc.).

The above and other objects, features and advantages of the present invention will become apparent from the following description and the appended claims, taken in conjunction with the accompanying drawings, in which like parts or elements are denoted by like reference numbers.

DETAILED DESCRIPTION OF EXEMPLARY EMBODIMENTS

The illustration in the drawing is schematically.

Before describing further exemplary embodiments in further detail, some basic considerations of the present invention will be summarized based on which exemplary embodiments have been developed.

According to an exemplary embodiment, a polymer-based dielectric structure for a chip package (in particular a semiconductor package) is provided which allows obtaining low moisture absorption, high mechanical stability and/or high electrical insulation (in particular high break-through strength). It is further desired to obtain a high UPH for the application of such polymers for semiconductor packaging.

Conventionally, thermoset materials (preferred epoxy resin) are used for forming dielectric structures for the packaging of semiconductor devices. Such thermoset materials are in-situ formed by the application of heat to enable the cross-linking and hardening of those materials providing them their thermoset properties. However, disadvantages of such thermosets are typically a high moisture absorption, a limited and small process temperature range (about 150° C. to 200° C.), a limited insulation strength, a high stress level on devices during reliability, and a limited UPH based on the quite high curing time inside the mold cavities during transfer molding. Furthermore, it is difficult or impossible to solve thermoset polymers in an organic solvent, and therefore the application as thin films or layers from a liquid are very difficult to achieve.

A gist of an exemplary embodiment is to use for chip packaging (in particular for semiconductor packaging) a thermoplastic polymer which may be mixed with hardeners (which may also be denoted as cross-linking agents) for crosslinking and/or which may be cross-linked by subsequent electron radiation to transfer the thermoplastic polymer in a cross-linked thermoplastic material with thermoset material properties and additional advantageous properties due to the thermoplastic character. For example, a corresponding dielectric structure may be used for encapsulation, coating or electrical insulation layer. Highly advantageously, such a dielectric structure may be manufactured with a high percentage of filler particles and additives which are freely selectable and combinable with the cross-linked thermoplastic material for tuning the properties of the dielectric structure. For instance, an optically opaque property of the dielectric structure may be promoted by adding one or more colorants such as black carbon. This optical opaqueness improves the electric performance of the chip package. Also filler particles may be advantageously added in high amount for instance for increasing thermal conductivity of the dielectric structure, for promoting adhesion, and/or to add a further or another functionality.

Descriptively speaking, a gist of exemplary embodiments is the hybrid combination of benefits of thermoplastic material and benefits of thermosets for designing a dielectric structure for a chip package.

In particular, conventional thermoplastic systems suffer from the huge disadvantage of limited thermo-mechanical stability due to their low melting temperature or glass transition temperature (Tg) and a low temperature stability. However, thermoplastic materials often have a very low tendency of moisture absorption (for example less polar thermoplastics are absorbing very low moisture), but have an insufficient temperature stability. Further advantageously, thermoplastic materials, when used for a dielectric structure of the package, may improve the electrical break-through strength (in particular in view of the fact of a normally less polar thermoplastics revealing a significantly higher electrical break-through or insulation strength). Beyond this, thermoplastic materials enable lower process temperatures (many polar thermoplastics have a process temperature significantly below 200° C. and even below 150° C.). As compared to conventional thermosetting materials, thermoplastic materials have a much higher UPH of injection molding (for thermoplastics) than for transfer or compression molding (for thermosets). In terms of stress buffer layers between the encapsulation compound and the chip, wires, and chip carrier, thermoplastic materials are typically much more soft (i.e. have a lower Young module) than thermosets. It may be very important to protect sensitive material such as SiC and GaN against the negative impact of conventional epoxy molding compounds in terms of electrical functionalities and even mechanical chip cracks. A further advantage of thermoplastic polymers is that they are easy to solve in dedicated and suitable solvents.

By providing a dielectric structure comprising a cross-link thermoplastic material (highly advantageously being highly filled with filler particles and additives) allows obtaining in combination a reduced moisture absorption, an increased dielectric strength, and a high flexibility to select the suitable thermoplastic system accordingly for equipping it with cross-linking agents and/or do the electron irradiation to transfer it to a thermoset with higher thermal and mechanical stability.

A gist of an exemplary embodiment is therefore to use a thermoplastic polymer equipped with cross-linking agents and functionalities for basic encapsulation with simple processes useful for thermoplastic processing, like injection molding, coating, casting, etc.

Preferred polymers which may be used as a basis for designing the dielectric structure are technical thermoplastics like polyamides or high performance polymers, like PEEK (polyetheretherketone), showing already as simple thermoplastics a good thermal and mechanical performance, or highly crystalline polymers, like HD-PE (High Density Polyethylene) or POM (polyoxymethylene) having a very low moisture absorption due to their low polarity and their highly crystalline structures. All of these materials are compatible with cross-linking additives and/or irradiation by an energetic beam to manufacture a dielectric structure with highly advantageous properties in terms of high thermal performance, high mechanical performance and high electrical performance.

According to an exemplary embodiment, a thermoplastic based polymer material may be used as dielectric structure for packaging, in particular for encapsulation, as primary buffer and/or for protective coating or external electrical insulation. In particular, a dielectric structure according to an exemplary embodiment may be used for external insulation of an exposed pad against a heat sink attached to an exterior of one or more packages. Crosslinking of corresponding materials may be carried out in-situ with the processing (for instance encapsulation) or after the processing to form a thermoset-like high performance polymer. This may be achieved by the mixing of a thermoplastic material with one or more cross-linking agents (like silanes, peroxides, azo groups, etc.) and/or by the simple radiation with an energetic beam (for instance by electron radiation, β-radiation or even electromagnetic radiation).

FIG. 1 shows a cross-sectional view of a pre-form of a package 100 according to an exemplary embodiment.

FIG. 1 illustrates a chip carrier 102, which is here embodied as leadframe made of copper. Four (any other number is possible as well) electronic chips 108, which are here configured as power semiconductor chips, are mounted (for instance soldered) on an upper main surface of the chip carrier 102. A plurality of electrically conductive pads 150 are formed on the electronic chips 108 and are mounted face up, i.e. facing away from the mounting surface of the chip carrier 102.

Next, it will be described as to how a dielectric structure 104, embodied as mold type encapsulant, is formed to encapsulate the exposed surface portions of the electronic chips 108 as well as a part of the exposed surface of the chip carrier 102. In the following, different embodiments of forming this dielectric structure 104 will be described:

On the left-hand side of FIG. 1, a base material 160 for forming the electric structure 104 is shown. This base material 160 is composed of a mixture of a thermoplastic material 106 (for instance PEEK), a cross-linking agent 124 (for instance a peroxide) for triggering cross-linking of the thermoplastic material 106 when being melted by heating, a large amount (for instance at least 60 weight percent related to an entire weight of the base material 160) of filler particles 114 (for instance aluminum nitride particles for improving thermal conductivity of the dielectric structure 104 to be manufactured, and carbon black as colorant for rendering the dielectric structure 104 to be manufactured optically intransparent or opaque), and further additives (not shown). The base material 160 is heated and thereby melted and is then supplied to a molding chamber of a molding tool (not shown) in which also the assembly of the chip carrier 102 and the electronic chips 108 is accommodated. Cross-linking of the thermoplastic material 106 is triggered by supplying sufficient heat for activating the cross-linking agent 124 during the molding process. The presence of the cross-linking agent 124 will therefore force chains 110 of the polymeric thermoplastic material 106 to be cross-linked by a cross-linking structure 112 (compare detail 152 in FIG. 2) being a reaction product of the cross-linking reaction initiated by the cross-linking agent 124. After having completed the cross-linking reaction, the dielectric structure 104 hardens and forms an encapsulant 116, as shown in FIG. 2.

Additionally or alternatively, as illustrated schematically on the right hand side of FIG. 1, it is possible to trigger the cross-linking by irradiating the thermoplastic material 106 with an energetic electron beam 154 generated by an electron beam source 156. A base material 162 is provided which is composed of a mixture of a thermoplastic material 106 (for instance PEEK) and a large amount (for instance at least 60 weight percent related to an entire weight of the base material 162) of filler particles 114 (for instance aluminum nitride particles for improving thermal conductivity of the dielectric structure 104, and carbon black as colorant for rendering the dielectric structure 104 to be manufactured optically intransparent or opaque), and further additives (not shown). The base material 162 is heated and thereby melted and is then supplied to a molding chamber of a molding tool (not shown) in which also the assembly of the chip carrier 102 and the electronic chips 108 is accommodated. A semifinished product which is obtained as a result comprises thermoplastic material 106 (still substantially without cross-links) having the filler particles 114 embedded therein. Upon irradiating this hardened semifinished product—already covering the electronic chips 108 and the chip carrier 102—with the energetic electron beam 154 will trigger cross-linking of the thermoplastic material 106 so that a dielectric structure 104 corresponding to detail 152 in FIG. 2 will be obtained, however with the difference that no cross-linking structures 112 will be present since no cross-linking agent 124 has been provided in base material 162. Also with this treatment, a cross-linked thermoplastic material 106 will be obtained.

In a third alternative, cross-linking triggered by cross-linking agent 124 and cross-linking triggered by an energetic electron beam 154 may be combined. This may allow obtaining a high degree of cross linking and thus a dielectric structure with highly advantageous properties.

Figure 2:
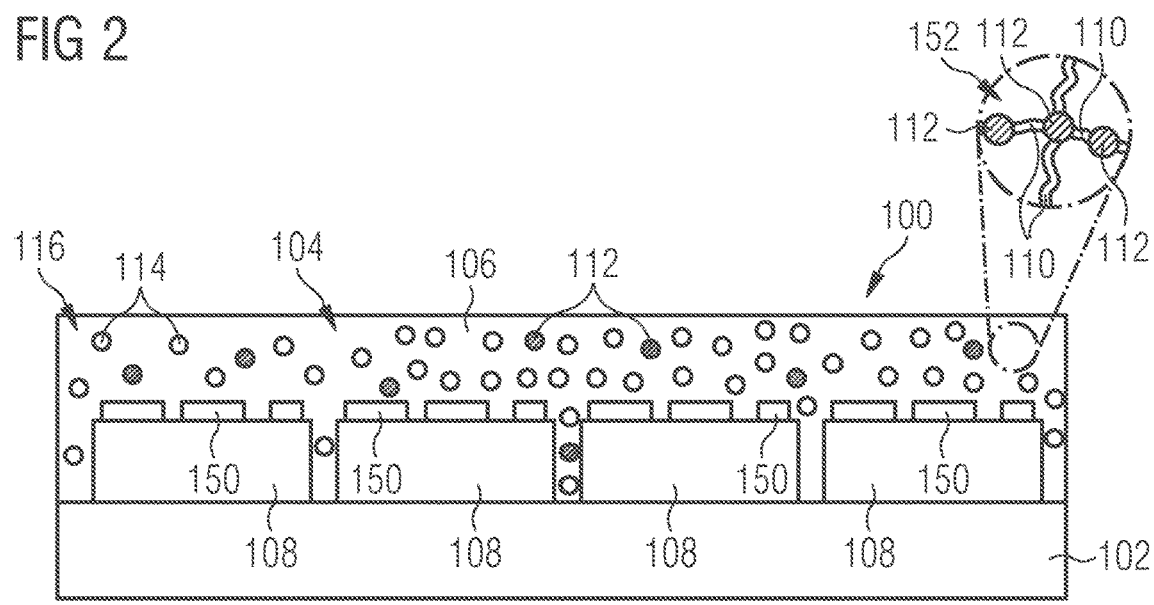
FIG. 2 shows a cross-sectional view of a package manufactured in accordance with FIG. 1 according to an exemplary embodiment.

FIG. 2 shows a cross-sectional view of a package 100 according to an exemplary embodiment as obtained when carrying out the first or third alternative described referring to FIG. 1.

The shown package 100 is composed of the chip carrier 102, the electronic chips 108 mounted on the chip carrier 102, and the encapsulant-type dielectric structure 104 covering part of the chip carrier 102 and the electronic chips 108 and comprising highly filled cross-linked thermoplastic material 106. As can be taken from detail 152, the cross-linked thermoplastic material 106 comprises polymeric chains 110 being connected by the cross-linking structure 112 resulting from the cross-linking agent 124 shown in FIG. 1. Depending on the adjustment of the process parameters of the cross-linking process triggered according to FIG. 1 (in particular the amount of cross-linking agent 124 and/or the intensity of the energetic electron beam 154, etc.), the cross-linked thermoplastic material 106 may have a degree of cross-linking in a range between 2% and 90%, for instance of 20%.

The highly filled dielectric structure 104 comprises a significant amount of the filler particles 114. Thanks to the supply of carbon black or another appropriate colorant as additive or filler particles 114 to the dielectric structure 104, the latter is substantially optically opaque, for instance has an optical transparency of only 1%. This prevents optical light from propagating into the package 100 which increases the electric reliability of the package 100. Due to the supply of aluminum nitride filling particles 114 to the dielectric structure 104, the dielectric structure 104 may have a high value of the thermal conductivity of for example 1 or 2 W/(mK). As a consequence, thermal heat generated during operation of the power semiconductor type electronic chips 108 during operation of the package 100 may be efficiently removed from the package 100 so as to improve the thermal performance of the package 100. Due to the cross-linking of the thermoplastic material 106, the obtained dielectric structure 104 has a high mechanical stability and is thermally stable for instance at least up to 300° C. As a result, the package 100 may be soldered to a mounting base (such as a printed circuit board, not shown) for example at a typical solder temperature of 260° C. without deteriorating the properties of the dielectric structure 104 or the package 100 as a whole. Moreover, the cross-linked thermoplastic material 106 advantageously prevents moisture from entering into the package 100. Also the electric insulation properties of the dielectric structure 104 are highly reliable which has a positive impact on the electric performance of the package 100.

Thus, the embodiment of FIG. 1 and FIG. 2 provides a cross-linked thermoplastics material 106 for encapsulation, or in other words as encapsulant 116, of chip carrier 100 and the electronic chips 108. Hence, the described embodiment provides cross-linked thermoplastics for device encapsulation.

In an embodiment, it is also possible to do protective coating (for instance by forming a corresponding layer having a thickness in the range between 10 μm and 100 μm)

of for example wire bonded or clip bonded devices on a leadframe or other chip carrier 102 with cross-linked thermoplastic material 106.

Cross-linking can be accomplished by providing cross-linking agents 124, like peroxides, azo-structures, etc., which can decompose by temperature or ultraviolet radiation into a radical structure, i.e. a structure with an unpaired electron to cause a reaction of the thermoplastic chains 110 to cross-linked, thermoset-like dielectric structure 104 having still thermoplastic properties. Alternatively, this cross-linking may be caused via any electron radiation afterwards (so that no cross-linking agent 124 inside the thermoplastic formulation is required, but is nevertheless possible).

Figure 3:
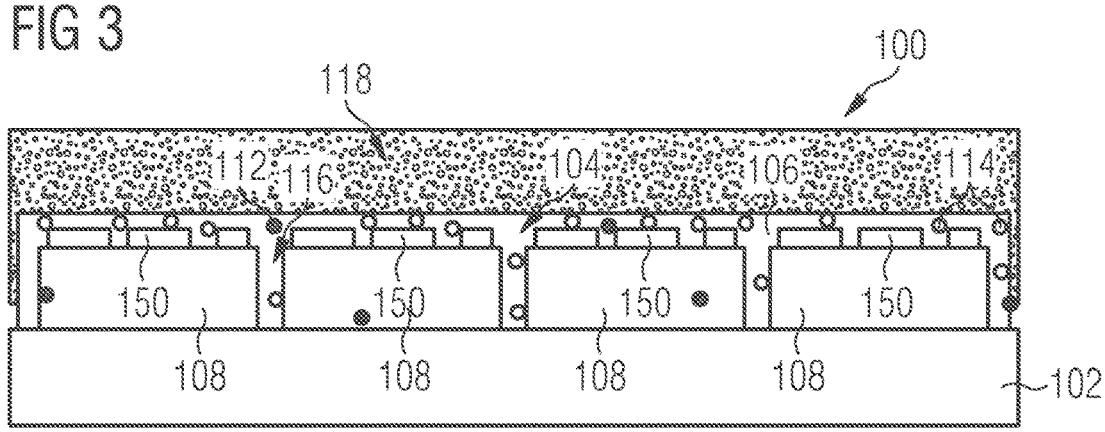
FIG. 3 shows a cross-sectional view of a package according to another exemplary embodiment.

FIG. 3 shows a cross-sectional view of a package 100 according to another exemplary embodiment.

The embodiment of FIG. 3 differs from the embodiment of FIG. 2 in that the embodiment of FIG. 3 additionally comprises a further encapsulant 118 encapsulating part of the previously described encapsulant 116. For example, the further encapsulant 118 comprises a thermoset material such as an epoxy based material and/or a silicone based material.

Figure 4:
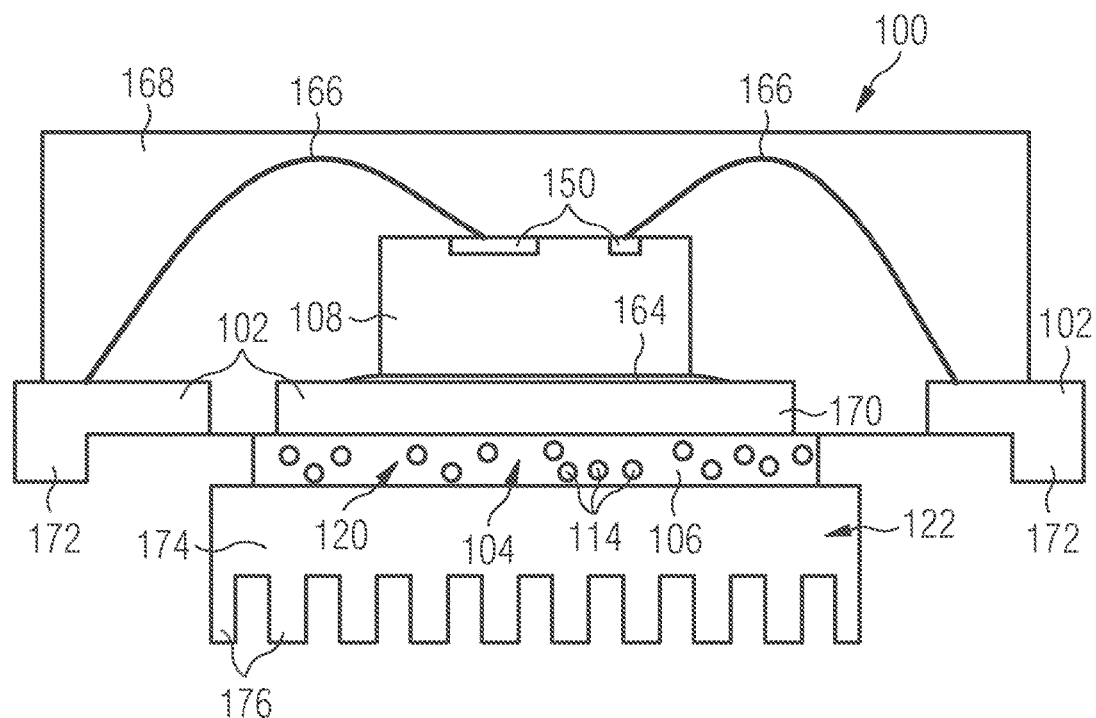
FIG. 4 shows a cross-sectional view of a package according to still another exemplary embodiment.

FIG. 4 shows a cross-sectional view of a package 100 according to still another exemplary embodiment.

In the package 100 according to FIG. 4, the electronic chip 108 is mounted, via a connection structure 164 such as a solder material or a glue, on a die pad 170 of a leadframe type chip carrier 102. Pads 150 on an upper main surface of the electronic chip 108 may be electrically connected by electrically conductive connection elements 166 (here embodied as bond wires) with lead sections 172 of the chip carrier 102. Parts of the chip carrier 102, the electronic chip 108 and the electrically conductive connection elements 166 are encapsulated by yet another encapsulant 168 such as a conventional epoxy resin based mold compound.

Moreover, a layer type dielectric structure 104 comprising a highly filled optically opaque cross-linked thermoplastic material 106 is coated to cover the exposed lower main surface of the die pad 170 of the chip carrier 102. Thus, in the embodiment of FIG. 4, the dielectric structure 104 is configured as a layer structure 120 (here embodied as a single continuous layer) covering an exposed portion of the carrier 102. The layer structure 120, in turn, may be covered by a heat sink 122 to further improve the thermal performance of the package 100. In the shown embodiment, the heat sink 122 comprises a thermally conductive plate-shaped body 174 integrally formed with a plurality of cooling fins 176. It is however alternatively also possible to use a simple copper plate as heat sink 122 attached to the dielectric structure 104 for cooling. In the shown embodiment, the layer type dielectric structure 104 provides for a high electrical break-through strength and a low moisture absorption.

Figure 5:
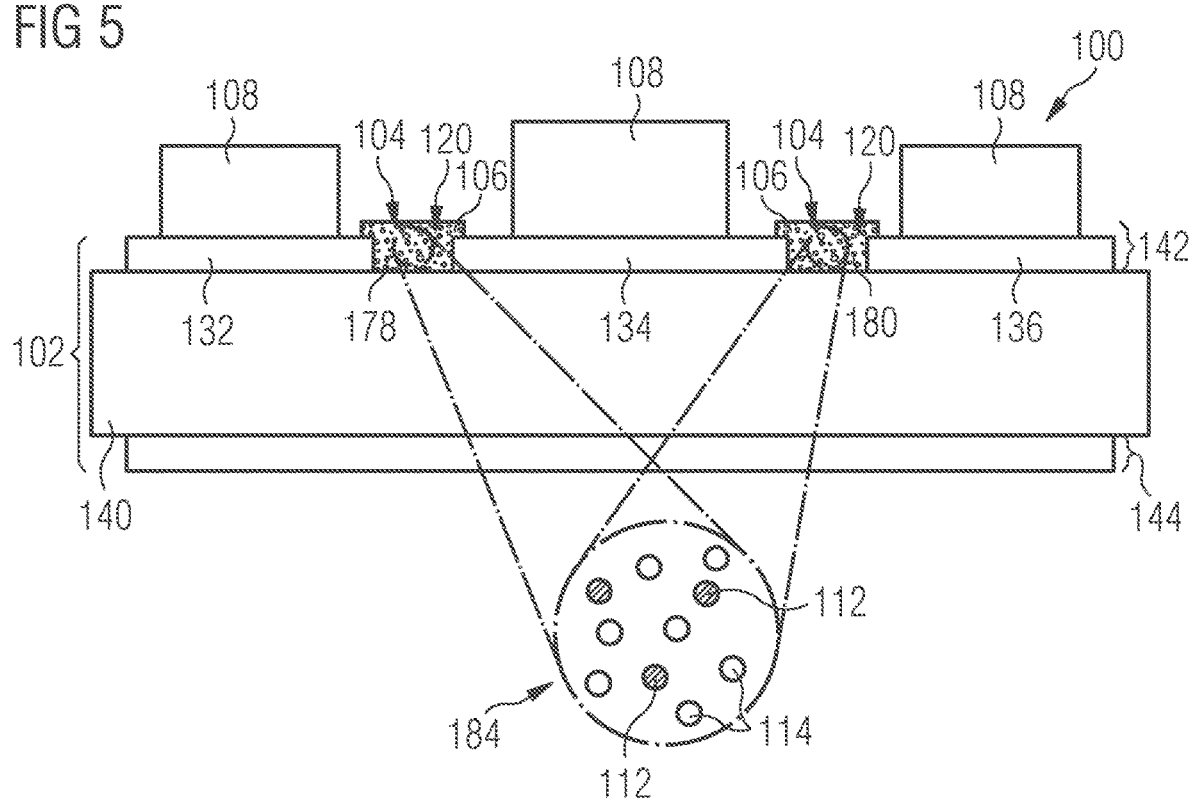
FIG. 5 shows a cross-sectional view of a package according to yet another exemplary embodiment.

FIG. 5 shows a cross-sectional view of a package 100 according to yet another exemplary embodiment.

In the embodiment of FIG. 5, the layer structure 120 comprises dielectric islands 178, 180 arranged to electrically insulate different electrically conductive portions 132, 134, 136 of the carrier 102 from one another. In the shown embodiment, the chip carrier 102 is configured as a DCB substrate, i.e. a sandwich arrangement of a central thermally conductive and electrically insulating layer 140 (for instance a ceramic plate) covered on both opposing main surfaces thereof with a respective electrically conductive layer 140, 142 (for instance copper sheets). Electrically conductive layer 142 is patterned into the electrically conductive portions 132, 134, 136. Between electrically conductive portions 132, 134, dielectric island 178 comprising a highly cross-linked thermoplastic material 106 may ensure proper electric decoupling. Between electrically conductive portions 134, 136, dielectric island 180 comprising a highly cross-linked thermoplastic material 106 may ensure proper electric decoupling as well. As can be taken from a detail 184, the dielectric islands 178, 180 may be composed according to the composition of the dielectric structure 104 according to FIG. 2 to FIG. 4.

Thus, the dielectric structure 104 may provide an electrical break-through protection for the shown DCB device. In other words, an insulating cross-linked thermoplastic is provided for high electrical insulation strength between the shown copper metallization layers. Also in this embodiment, cross-linking can be accomplished by electron radiation in a batch process. As an alternative, a complete coating with cross-linking thermoplastic material 106 may be carried out after die bonding and wire bonding as a complete electrical insulation layer protection.

It should be noted that the term "comprising" does not exclude other elements or features and the "a" or "an" does not exclude a plurality. Also elements described in association with different embodiments may be combined. It should also be noted that reference signs shall not be construed as limiting the scope of the claims. Moreover, the scope of the present application is not intended to be limited to the particular embodiments of the process, machine, manufacture, composition of matter, means, methods and steps described in the specification. Accordingly, the appended claims are intended to include within their scope such processes, machines, manufacture, compositions of matter, means, methods, or steps.

What is claimed is:

1. A package, comprising:
an electronic chip; and
a dielectric structure comprising a highly filled cross-linked thermoplastic material, wherein the dielectric structure comprises or consists of an encapsulant at least partially encapsulating the electronic chip, wherein the cross-linked thermoplastic material comprises chains connected by a cross-linking structure, wherein the cross-linked thermoplastic material has a degree of cross-linking in a range between 2% and 90%, and wherein the degree of cross-linking is a percentage of repetitive monomer units in the chains of the cross-linked thermoplastic material.

2. The package according to claim 1, wherein the dielectric structure comprises at least 50 weight percent filler particles in relation to the entire weight of the dielectric structure.

3. The package according to claim 2, wherein the filler particles comprise at least one of the group consisting of thermally highly conductive filler particles, a colorant, an adhesion promoter, and a catalyst.

4. The package according to claim 1, wherein the dielectric structure is opaque.

5. The package according to claim 1, comprising a further encapsulant at least encapsulating at least part of the encapsulant.

6. The package according to claim 5, wherein the further encapsulant comprises a thermosetting material.

7. The package according to claim 1, wherein the dielectric structure comprises a layer structure covering at least part of the electronic chip.

8. The package according to claim 7, wherein the layer structure is arranged to electrically insulate different electrically conductive portions of a chip carrier of the package from one another, on which chip carrier the electronic chip is mounted.

9. The package according to claim 1, wherein the thermoplastic material comprises at least one of the group consisting of polyamide, polyetheretherketone, polyethylene terephthalate, polybutylene terephthalate, polyimide, polysulfone, high density polyethylene, polyoxymethylene, polypropylene, and polystyrene.

10. The package according to claim 1, comprising a chip carrier on which the electronic chip is mounted.

11. The package according to claim 10, wherein the dielectric structure covers at least part of at least one of the electronic chip and the chip carrier.

12. A package, comprising:
an electronic chip; and
a dielectric structure covering at least part of the electronic chip and comprising an optically opaque cross-linked thermoplastic material, wherein the cross-linked thermoplastic material comprises chains connected by a cross-linking structure, wherein the cross-linked thermoplastic material has a degree of cross-linking in a range between 2% and 90%, and wherein the degree of cross-linking is a percentage of repetitive monomer units in the chains of the cross-linked thermoplastic material.

13. A method of manufacturing a package, the method comprising:
mounting an electronic chip on a chip carrier; and
forming a dielectric structure covering at least part of the electronic chip by cross-linking a highly filled thermoplastic material, wherein cross-linking the highly filled thermoplastic material comprises connecting chains by a cross-linking structure, wherein the highly filled thermoplastic material has a degree of cross-linking in a range between 2% and 90%, and wherein the degree of cross-linking is a percentage of repetitive monomer units in the chains of the highly filled thermoplastic material.

14. The method according to claim 13, wherein the method comprises triggering the cross-linking by adding a cross-linking agent to the thermoplastic material and by activating the cross-linking agent.

15. The method according to claim 14, wherein the cross-linking agent comprises at least one of the group consisting of a peroxide, an azo-structure, and a silane.

16. The method according to claim 14, wherein activating the cross-linking agent comprises heating a mixture of the thermoplastic material and the cross-linking agent.

17. The method according to claim 13, wherein the method comprises triggering the cross-linking by irradiating the thermoplastic material with an energetic beam.

18. The method according claim 13, wherein forming the dielectric structure comprises at least one the group consisting of molding, coating, and casting.

* * * * *